(12) United States Patent
Wang et al.

(10) Patent No.: US 10,026,758 B2
(45) Date of Patent: Jul. 17, 2018

(54) ARRAY SUBSTRATE, MANUFACTURING METHOD THEREOF, DISPLAY PANEL, AND DISPLAY DEVICE

(71) Applicants: BOE TECHNOLOGY GROUP CO., LTD., Beijing (CN); BEIJING BOE DISPLAY TECHNOLOGY CO., LTD., Beijing (CN)

(72) Inventors: Ruirui Wang, Beijing (CN); Huabin Chen, Beijing (CN); Linlin Wang, Beijing (CN); Xiaopeng Cui, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 15/782,240

(22) Filed: Oct. 12, 2017

(65) Prior Publication Data
US 2018/0033802 A1    Feb. 1, 2018

Related U.S. Application Data

(62) Division of application No. 15/336,145, filed on Oct. 27, 2016, now Pat. No. 9,818,769.

(30) Foreign Application Priority Data

Feb. 24, 2016 (CN) .......................... 2016 1 0101972

(51) Int. Cl.
H01L 29/04    (2006.01)
H01L 31/036   (2006.01)
H01L 27/12    (2006.01)

(52) U.S. Cl.
CPC ........ H01L 27/124 (2013.01); H01L 27/1262 (2013.01)

(58) Field of Classification Search
CPC ............... H01L 27/124; H01L 27/1214; H01L 27/1262
(Continued)

(56) References Cited

U.S. PATENT DOCUMENTS 6,373,546 B1 *   4/2002   Kim .................... G02F 1/13458
                                                      257/E29.151
2003/0012869 A1   1/2003   Kido
(Continued)

FOREIGN PATENT DOCUMENTS

CN    100351692 C    11/2007
CN    102566172 A    7/2012
(Continued)

OTHER PUBLICATIONS

USPTO RR dated Apr. 21, 2017 in connection with U.S. Appl. No. 15/336,145.
(Continued)

Primary Examiner — Theresa T Doan
(74) Attorney, Agent, or Firm — Ladas & Parry LLP; Loren K. Thompson

(57) ABSTRACT

An array substrate, a manufacturing method thereof, a display panel and a display device are disclosed. The manufacturing method includes: forming a first metal wiring, an interlayer insulating film, a second metal wiring and a protecting layer in sequence on a substrate, the second metal wiring is parallel with the first metal wiring and has an overlapped area therewith which is defined as a first zone, and portions of the first and second metal wiring except the first zone are defined as a second zone and a third zone respectively; at least thinning a portion of the interlayer insulating film and/or the protecting layer corresponding to
(Continued)

the first zone while leaving portions except those corresponding to the first, second and third zones un-thinned. The manufacturing method can mitigate Zara mura.

7 Claims, 2 Drawing Sheets

(58) Field of Classification Search
USPC .......................................................... 257/72
See application file for complete search history.

(56) References Cited

U.S. PATENT DOCUMENTS

| 2006/0001815 | A1 | 1/2006 | Kim et al. |
| 2008/0128699 | A1* | 6/2008 | Seong .................. G02F 1/1345 257/59 |
| 2008/0303020 | A1 | 12/2008 | Shin et al. |
| 2011/0163310 | A1 | 7/2011 | Park et al. |
| 2013/0021551 | A1 | 1/2013 | Yu et al. |
| 2013/0309819 | A1 | 11/2013 | Lee |
| 2014/0138718 | A1 | 5/2014 | Liu et al. |

FOREIGN PATENT DOCUMENTS

| CN | 102890373 A | 1/2013 |
| CN | 102929060 A | 2/2013 |
| CN | 103107140 A | 5/2013 |

OTHER PUBLICATIONS

USPTO NOA dated Jul. 14, 2017 in connection with U.S. Appl. No. 15/336,145.

The First Chinese Office Action dated Apr. 4, 2018; Appln. No. 201610101972.9.

* cited by examiner

ARRAY SUBSTRATE, MANUFACTURING METHOD THEREOF, DISPLAY PANEL, AND DISPLAY DEVICE

TECHNICAL FIELD

Embodiments of the present invention relate to an array substrate, a manufacturing method thereof, a display panel and a display device.

BACKGROUND

At present, a configuration for a pixel unit to achieve a high aperture ratio is to dispose its common line (com line) beneath and parallel with its data line, i.e. projections of the two types of signal lines on the substrate have an overlap there-between, so as to reduce a occupation of active area (AA) when the two types of signal lines are disposed alternately, and to increase the aperture ratio of the pixel unit.

SUMMARY

At least one embodiment of the present invention provides an array substrate, a manufacturing method thereof, a display panel and a display device which can reduce a height difference between a pixel electrode region and an overlapped area of corn line with data line in normal pixel design for high aperture ratio, and hence mitigate Zara mura in liquid crystal display (LCD) device.

In order to achieve the above objective, embodiments of the present invention utilize technical solutions as below.

On one aspect, a manufacturing method of an array substrate, comprising: forming a first metal wiring on a base substrate; forming an interlayer insulating film covering the first metal wiring; forming a second metal wiring on the interlayer insulating film, the second metal wiring being parallel to and overlapped with the first metal wiring, wherein a portion of the first metal wiring overlapping with the second metal wiring being a first zone, a portion of the first metal wiring except the first zone being a second zone, and a portion of the second metal wiring except the first zone being a third zone; and forming a protecting layer covering the second metal wiring, wherein one of the first metal wiring and the second metal wiring being a common line and the other one being a data line. The manufacturing method further comprising at least one of: at least thinning a portion of the interlayer insulating film corresponding to the first zone while leaving portions of the interlayer insulating film except those corresponding to the first, second and third zones un-thinned; and at least thinning a portion of the protecting layer corresponding to the first zone while leaving portions of the protecting layer except those corresponding to the first, second and third zones un-thinned.

On the other aspect, an array substrate, comprising: a first metal wiring located on a base substrate; an interlayer insulating film covering the first metal wiring; a second metal wiring located on the interlayer insulating film, the second metal wiring being parallel to and overlapped with the first metal wiring; and a protecting layer covering the second metal routing layer, wherein one of the first metal wiring and the second metal wiring being a common line and the other one being a data line; a portion of the first metal wiring overlapping with the second metal wiring being a first zone, a portion of the first metal wiring except the first zone being a second zone, and a portion of the second metal wiring except the first zone being a third zone. The array substrate further comprises at least one of: at least a portion of the interlayer insulating film corresponding to the first zone having a thickness smaller than that of portions of the interlayer insulating film except those corresponding to the first, second and third zones; and, at least a portion of the protecting layer corresponding to the first zone having a thickness smaller than that of portions of the protecting layer except those corresponding to the first, second and third zones.

BRIEF DESCRIPTION OF THE DRAWINGS

Hereafter, the embodiments of the present invention will be described in detail with reference to the drawings, so as to make one person skilled in the art understand the present invention more clearly.

DETAILED DESCRIPTION

In order to make objects, technical details and advantages of the embodiments of the invention apparent, technical solutions according to the embodiments of the present invention will be described clearly and completely as below in conjunction with the accompanying drawings of embodiments of the present invention. It is to be understood that the described embodiments are only a part of but not all of exemplary embodiments of the present invention. Based on the described embodiments of the present invention, various other embodiments can be obtained by those of ordinary skill in the art without creative labor and those embodiments shall fall into the protection scope of the present invention.

Unless otherwise defined, all the technical and scientific terms used herein have the same meanings as commonly understood by one of ordinary skill in the art to which the present invention belongs. The terms, such as "first," "second," or the like, which are used in the description and the claims of the present application, are not intended to indicate any sequence, amount or importance, but for distinguishing various components. Also, the terms, such as "a/an," "one," or the like, are not intended to limit the amount, but for indicating the existence of at lease one. The terms, such as "comprise/comprising," "include/including," or the like are intended to specify that the elements or the objects stated before these terms encompass the elements or the objects and equivalents thereof listed after these terms, but not preclude other elements or objects. The terms, such as "connect/connecting/connected," "couple/coupling/coupled" or the like, are not intended to define a physical connection or mechanical connection, but may include an electrical connection/coupling, directly or indirectly. The terms, "on," "under," "left," "right," or the like are only used to indicate relative position relationship, and when the position of the object which is described is changed, the relative position relationship may be changed accordingly.

Figure 1:
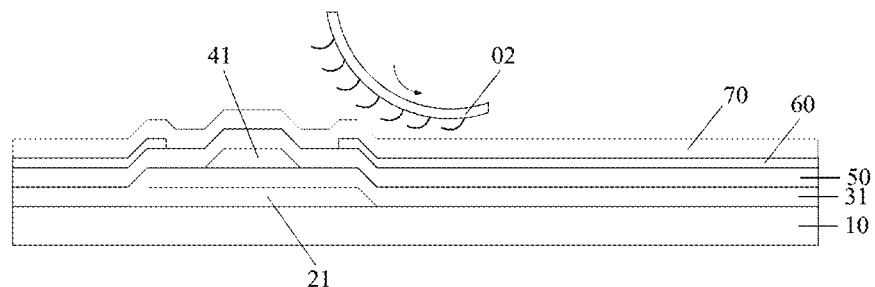
FIG. 1 is a cross-sectional diagram illustrating a pixel unit with a high aperture ratio.
Figure 2:
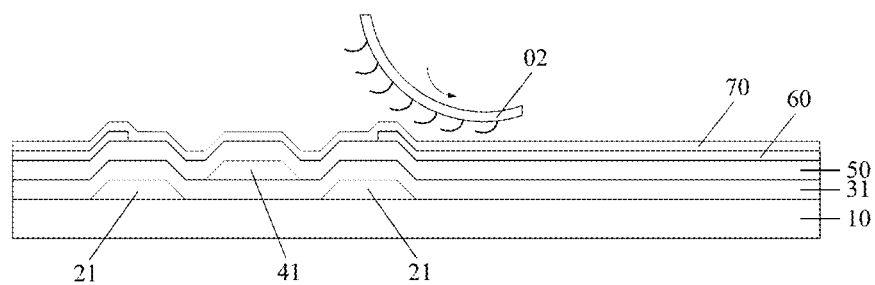
FIG. 2 is a cross-sectional diagram illustrating a pixel unit with a low aperture ratio.
Figure 3A:
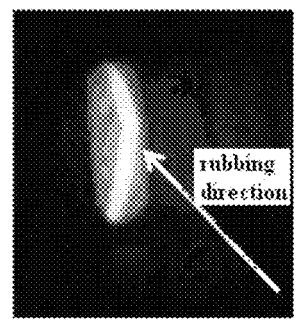
FIG. 3A is a photograph illustrating Zara mura of a pixel unit with a high aperture ratio caused by a height difference.
Figure 3B:
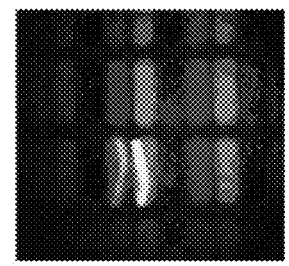
FIG. 3B is a partially enlarged view of FIG. 3A.

With regard to a configuration of a pixel unit with a high aperture ratio as illustrated in FIG. 1, the inventor has realized that: since a data line 41 is disposed over a corn line 21 and has an overlap with the corn line 21, a height difference generated between a position in an outermost alignment layer 70 corresponding to the data line 41 and a position in the outermost alignment layer 70 corresponding to a pixel electrode 60 may be larger than that in a conventional product (i.e. a pixel unit with low aperture ratio that has the two types of signal lines disposed alternately) illustrated in FIG. 2 by nearly 4000 Å (just a thickness of the data line 41). When a rubbing alignment process is performed on the alignment layer 70 by a rubbing roller 02, such height difference may result in areas with abnormal rubbing alignment in the alignment layer 70 at edges of the pixel unit adjacent to both sides of the data line 41, that is, an alignment orientation of such area is inconsistent with that of the AA area of the pixel unit, which may lead to occurrence of Zara mura, i.e. the deviating bright lines illustrated in FIG. 3, in the liquid crystal display (LCD) panel, at positions corresponding to the areas with abnormal rubbing alignment, thereby influencing a display quality.

As illustrated in FIGS. 4A-4D, an embodiment of the present invention provides an improved manufacturing method of an array substrate 01, including steps of: forming a first metal wiring 20 on a base substrate 10; forming an interlayer insulating film 30 covering the first metal wiring 20; forming a second metal wiring on the interlayer insulating film 30, wherein the second metal wiring 40 is parallel to and overlapped with the first metal wiring 20; a portion of the first metal wiring 20 overlapping with the second metal wiring 40 is referred to as a first zone (indicated by "a" in the figures), a portion of the first metal wiring 20 except the first zone is referred to as a second zone (indicated by "b" in the figures), and a portion of the second metal wiring 40 except the first zone is referred to as a third zone (indicated by "c" in FIG.4D); and, forming a protecting layer 50 covering the second metal wiring 40.

In the present embodiment, one of the first metal wiring 20 and the second metal wiring 40 acts as a com line, and the other one acts as a data line. The manufacturing method further includes at least one of: at least thinning a portion of the interlayer insulating film 30 corresponding to the first zone while leaving portions of the interlayer insulating film 30 except those corresponding to the first zone a, the second zone b and the third zone c un-thinned; and at least thinning a portion of the protecting layer 50 corresponding to the first zone while leaving portions of the protecting layer 50 except those corresponding to the first zone a, the second zone b and the third zone c un-thinned.

It is to be noted that, firstly, the first metal wiring 20 being located on the base substrate 10 as described in the embodiment of the present invention means that the first metal wiring 20 may be disposed directly on a surface of the base substrate 10, or may be disposed on a surface of another film layer located on the base substrate 10; that is, the first metal wiring 20 is at an upper position with relative to the base substrate which is considered to be at a lower position.

Moreover, one of the first metal wiring 20 and the second metal wiring 40 acting as a corn line and the other one acting as a data line means that: when the first metal wiring 20 is a com line, the second metal wiring 40 is a data line; and when the first metal wiring 20 is a data line, the second metal wiring 40 is a com line.

Here, it is to be understood by those of ordinary skills in the art that the first metal wiring 20 and the second metal wiring 40 provided in the embodiment of the present invention are, at least, located in a display area of the array substrate 01, but can also be extending into a circuit area surrounding the display area; i.e. these metal wirings may be located throughout the whole array substrate 01.

Secondly, the manufacturing method of the array substrate 01 may further include: forming a Thin Film Transistor (TFT) and a pixel electrode.

In such step, for example, a gate electrode or a source/drain electrode in the TFT may be formed at the same time when forming the first metal wiring 20 by using a patterning process; and a source/drain electrode or a gate electrode in the TFT corresponding to the previously formed gate electrode or source/drain electrode may be formed at the same time when forming the second metal wiring 40 by using a patterning process. The interlayer insulating film 30 formed between the first metal wiring 20 and the second metal wiring 40 behaves as a gate insulating layer. Furthermore, the process of at least thinning a portion of the protecting layer 50 corresponding to the first zone a may be performed after etching the pixel electrode 60. The specific processing steps are well known in the art and will not be described in further details herein.

Thirdly, the first metal wiring 20 being parallel to and overlapped with the second metal wiring 40 as described above includes the following scenarios.

The first scenario

Figure 4A:
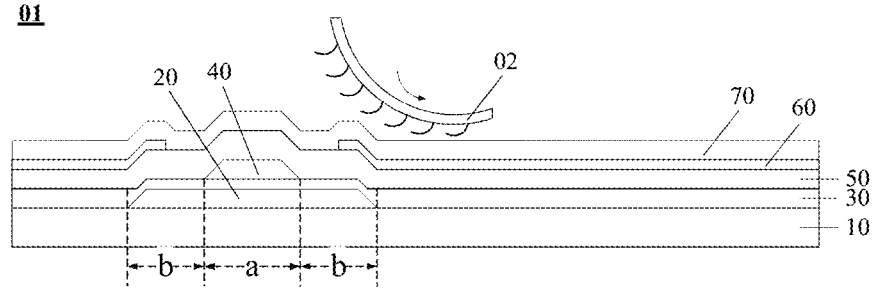
FIG. 4A is a first cross-sectional diagram illustrating an array substrate obtained by a manufacturing method provided in an embodiment of the present invention.
Figure 4B:
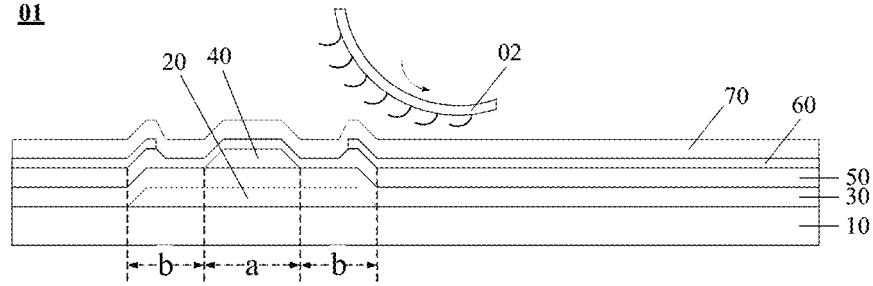
FIG. 4B is a second cross-sectional diagram illustrating an array substrate obtained by a manufacturing method provided in an embodiment of the present invention.
Figure 4C:
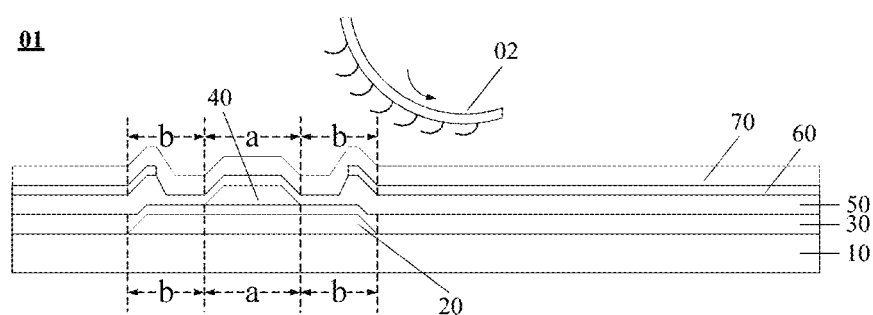
FIG. 4C is a third cross-sectional diagram illustrating an array substrate obtained by a manufacturing method provided in an embodiment of the present invention.

In this scenario, a projection of one of the two types of signal lines on the base substrate 10 completely covers that of the other one; that is, for example, when the first metal wiring 20 has a width larger than that of the second metal wiring 40, as illustrated in Figs.4A-4C, the projection of the first metal wiring 20 on the base substrate 10 completely covers the projection of the second metal wiring 40 on the base substrate 10.

In this case, since the projection of one of the two types of signal lines on the base substrate 10 completely covers that of the other one, given that the two types of signal lines have a same width, the portion of the first metal wiring 20 except the first zone, that is, the second zone has an area of zero; and a portion of the second metal wiring 40 except the first zone, that is, the third zone also has an area of zero.

In this way, at least thinning a portion of the interlayer insulating film 30 corresponding to the first zone while leaving portions of the interlayer insulating film 30 except those corresponding to the first, second and third zone un-thinned as described above can be: only thinning the portion of the interlayer insulating film 30 corresponding to the first zone.

When the two types of signal lines have different widths, since the projection of one of the two types of signal lines on the base substrate 10 completely covers that of the other one, one of the second zone and the third zone will have an area of zero.

In this way, at least thinning the portion of the interlayer insulating film 30 corresponding to the first zone while leaving portions of the interlayer insulating film 30 except those corresponding to the first, second and third zone un-thinned as described above can be: only thinning the portion of the interlayer insulating film 30 corresponding to the first zone, or thinning portions of the interlayer insulating film 30 corresponding to the first zone and the one of the second and third zones whose area is not zero.

Here, FIG. 4A is a schematic diagram illustrating a cross-sectional configuration of the array substrate 01 in which the portions of the interlayer film 30 corresponding to the first zone a and the second zone b have been thinned, that is, the portions subjected to the thinning process are a+b; FIG. 4B is a schematic diagram illustrating a cross-sectional configuration of the array substrate 01 in which the portions of the protecting layer 50 corresponding to the first zone a and the second zone b have been thinned, that is, the portions subjected to the thinning process are a+b; and FIG. 4C is a schematic diagram illustrating a cross-sectional configuration of the array substrate 01 in which both the portions of the interlayer film 30 corresponding to the first and second zone a, b and the portions of the protecting layer 50 corresponding to the first and second zone a, b have been thinned.

The second scenario

Figure 4D:
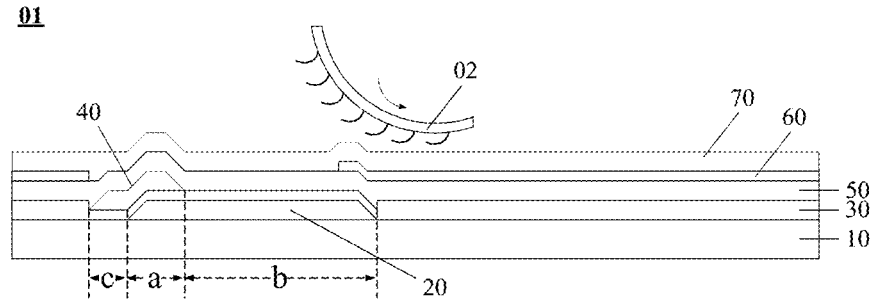
FIG. 4D is a fourth cross-sectional diagram illustrating an array substrate obtained by a manufacturing method provided in an embodiment of the present invention.

In this scenario, the projections of the two types of signal lines are only partially overlapped, i.e. neither the second zone b nor the third zone c has an area of zero, as can be seen in FIG. 4D. Still, a process of thinning the interlayer insulating film 30 will be described in details by way of example. It's to be noted that, FIG.4D only illustrates a structure of the array substrate 01 in which the portions of the interlayer insulating film 30 corresponding to the first zone a, the second zone b and the third zone c all have been thinned, and details of other examples in which the portion of the interlayer insulating film 30 corresponding to the first zone a is thinned, or the portions of the interlayer insulating film 30 corresponding to the first zone a and the second zone b are thinned, or the portions of the interlayer insulating film 30 corresponding to the first zone a and the third zone c are thinned may refer to that illustrated in FIG. 4D without repeating herein.

Here, considering that the projections of the two types of signal lines on the base substrate 10 are only partially overlapped, an effect of improving the aperture ratio may be restricted; moreover, since the second metal wiring 40 formed later and the first metal wiring 20 formed earlier are only partially overlapped and are not formed in a same plane, the second metal wiring 40 may be more difficult to be patterned and more likely to cause defect of broken lines. In view of this, in some embodiments, a projection of one of the first metal wiring 20 and the second metal wiring 40 on the base substrate 10 completely covers that of the other one.

In the manufacturing method provided in the embodiment of the present invention, the design in which at least a portion of the interlayer insulating film 30 corresponding to the first zone is thinned while leaving the portions of the interlayer insulating film 30 except those corresponding to the first, second and third zones un-thinned is proposed for reason that: if thinning is performed on the whole interlayer insulating film 30, a height difference between an upper signal line and a pixel electrode 60 in a corresponding pixel unit caused by the overlap of the com line with the data line existed in normal pixel design for high aperture ratio still cannot be reduced, and the effect of mitigating Zara mura in the LCD device may not be achieved.

Similarly, the design in which at least a portion of the protecting layer 50 corresponding to the first zone is thinned while leaving the portions of the protecting layer 50 except those corresponding to the first, second and third zones un-thinned is proposed for reason that: if thinning is performed on the whole protecting layer 50, a height difference between an upper signal line and a pixel electrode 60 in a corresponding pixel unit caused by the overlap of the com line with the data line existed in normal pixel design for high aperture ratio still cannot be reduced, and the effect of mitigating Zara mura in the LCD device may not be achieved.

Based on this, in accordance with the above-mentioned manufacturing method of the array substrate 01 provided in the embodiment of the present invention, the interlayer insulating film 30 between the com line and the data line which are disposed to be parallel and overlapped with each other is thinned, and/or, the protecting layer 50 covering the upper one of the com line and the data line is thinned, which reduces the height difference between a position in the outermost alignment layer 70 corresponding to the data line 41 and a position in the outermost alignment layer 70 corresponding to the pixel electrode 60, avoids an area with abnormal rubbing alignment occurred in the alignment layer at the edges of the pixel unit adjacent to both sides of the data line, solves the above-mentioned problem of Zara mura when the array substrate 01 with the above design of pixel unit for high aperture ratio is applied in a LCD device, and improves the display quality of the LCD device.

In some embodiments, considering that insufficient thinning of the interlayer insulating film 30 cannot obtain significant reduction in the height difference while excessive thinning of the interlayer insulating film 30 may result in the lower first metal wiring 20 exposed without protection of an insulating film, at least a portion of the interlayer insulating film 30 corresponding to the first zone may be thinned to a thickness within 45%~65% of the original thickness of the interlayer insulating film 30.

For example, when the thickness of the interlayer insulating film 30 is 4000 Å, at least the portion of the interlayer insulating film 30 corresponding to the first zone may be thinned to a thickness within an appropriate thickness range of 1800~2600 Å by etching or the like.

Similarly, in some embodiments, considering that insufficient thinning of the protecting layer 50 cannot obtain significant reduction in the height difference while excessive thinning of the protecting layer 50 may result in the lower second metal wiring 40 exposed without protection from an insulating film, at least the portion of the protecting layer 50 corresponding to the first zone may be thinned to a thickness within 45%~65% of the original thickness of the protecting layer 50.

For example, when the thickness of the protecting layer 50 is 4000 Å, at least the portion of the protecting layer 50 corresponding to the first zone may be thinned to a thickness within an appropriate thickness range of 1800~2600 Å by etching or the like.

In the above-mentioned embodiments, the com line has a width larger than that of the data line, and along a line width direction, the projection of the corn line on the base substrate 10 completely covers that of the data line, so that the lower corn line can also act as a shielding bar to block the light which is possible to be leaked from one side or both sides of the data line.

In some other embodiments, with reference to FIGS. 4A to 4C, portions of the corn line 40 that are not overlapped with the data line 20 are located at both sides of the data line. That is to say, the portions of the corn line 40 that are not overlapped with the data line 20 are located at both sides of the data line in a length direction of data line; and when viewing the array substrate 01 from above, the portions of the corn line 40 being not covered by the data line 20 can be observed at both sides of the data line 20, so that the corn line 40 can block the light which is possible to be leaked from pixel units located at both sides of the data line.

Furthermore, the portions of the corn line 40 located at both sides of the data line have a same width (referring to the width of the area b as illustrated in FIG. 4A), so that the corn line 40 can provide uniform light-blocking effects for the pixel units located at both sides of the data line 20.

In still other embodiments, considering that the width of the com line is usually larger than that of the data line, only thinning the portion of the interlayer insulating film 30 corresponding to the first zone a where the corn line and the data line are overlapped may involve problems of non-uniform etching or increased difficulty in etching and patterning, the above-mentioned process of thinning at least the portion of the interlayer insulating film 30 corresponding to the first zone while leaving the portions of the interlayer insulating film 30 except those corresponding to the first, second and third zones un-thinned may include: thinning the portions of the interlayer insulating film 30 corresponding to the first, second and third zones.

Similarly, in still other embodiments, considering that only thinning the portion of the protecting layer 50 corresponding to the first zone a where the corn line and the data line are overlapped may involve problems of non-uniform etching or increased difficulty in etching and patterning, the above-mentioned process of thinning at least the portion of the protecting layer 50 corresponding to the first zone while leaving the portions of the protecting layer 50 except those corresponding to the first, second and third zones un-thinned may include: thinning the portions of the protecting layer 50 corresponding to the first, second and third zones.

Based on the same inventive concept, an array substrate is further provided in an embodiment of the present invention. With reference to Figs.4A-4D, the array substrate 01 includes a first metal wiring 20 located on a base substrate 10; an interlayer insulating film 30 covering the first metal wiring 20; and a second metal wiring 40 located on the interlayer insulating film 30, wherein the second metal wiring 40 is parallel to and overlapped with the first metal wiring 20; a portion of the first metal wiring 20 overlapping with the second metal wiring 40 is referred to as a first zone, a portion of the first metal wiring 20 except the first zone is referred to as a second zone, and a portion of the second metal wiring 40 except the first zone is referred to as a third zone; at least the portion of the interlayer insulating film 30 corresponding to the first zone has a thickness smaller than that of the portions of the interlayer insulating film 30 except those corresponding to the first, second and third zones; and/or, at least the portion of the protecting layer 50 corresponding to the first zone has a thickness smaller than that of the portions of the protecting layer 50 except those corresponding to the first, second and third zones.

Based on the same inventive concept, a display panel is further provided in an embodiment of the present invention, the display panel includes the above-mentioned array substrate 01.

Based on the same inventive concept, a display device is further provided in an embodiment of the present invention, the display device includes the above-mentioned display panel.

The display device in accordance with the embodiment of the present invention may be any product or component with display functionality, such as LCD, LC TV, digital picture frame and mobile phone.

The foregoing are merely specific embodiments of the invention, but not limitative to the protection scope of the invention. Within the technical scope disclosed by the present invention, any alternations or replacements which can be readily envisaged by one skilled in the art shall be within the protection scope of the present invention. Therefore, the protection scope of the invention shall be defined by the accompanying claims.

The present invention claims the benefits of Chinese patent application No. 201610101972.9, which was filed with the SIPO on Feb. 24, 2016 and is fully incorporated herein by reference as part of this application.

What is claimed is:

1. An array substrate, comprising:
    a first metal wiring located on a base substrate;
    an interlayer insulating film covering the first metal wiring;
    a second metal wiring located on the interlayer insulating film, the second metal wiring being parallel to and overlapped with the first metal wiring; and
    a protecting layer covering the second metal routing layer, wherein
    one of the first metal wiring and the second metal wiring being a common line and the other one being a data line; a portion of the first metal wiring overlapping with the second metal wiring being a first zone, a portion of the first metal wiring except the first zone being a second zone, and a portion of the second metal wiring except the first zone being a third zone; and
    the array substrate further comprising at least one of:
    at least a portion of the interlayer insulating film corresponding to the first zone having a thickness smaller than that of portions of the interlayer insulating film except those corresponding to the first zone, second zone and third zone; and
    at least a portion of the protecting layer corresponding to the first zone having a thickness smaller than that of portions of the protecting layer except those corresponding to the first, second and third zones.

2. The array substrate of claim 1, wherein
    at least the portion of the interlayer insulating film corresponding to the first zone has a thickness within 45%~65% of a thickness of the portions of the interlayer insulating film except those corresponding to the first, second and third zones.

3. The array substrate of claim 1, wherein
    at least the portion of the protecting layer corresponding to the first zone has a thickness within 45%~65% of a thickness of the portions of the protecting layer except those corresponding to the first, second and third zones.

4. The array substrate of claim 1, wherein the common line has a width larger than that of the data line; and
    along a width direction, a projection of the common line on the base substrate completely covers a projection of the data line on the base substrate.

5. The array substrate of claim 4, wherein portions of the common line being not overlapped with the data line are located at both sides of the data line.

6. The array substrate of claim 5, wherein the portions of the common line located at both sides of the data line have a same width.

7. A display panel, comprising the array substrate of claim 1.

* * * * *